(12) United States Patent
Krivokapic (10) Patent No.: US 6,340,417 B1
(45) Date of Patent: Jan. 22, 2002

(54) REACTOR AND METHOD FOR IONIZED METAL DEPOSITION

(75) Inventor: Zoran Krivokapic, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 08/616,990

(22) Filed: Mar. 14, 1996

(51) Int. Cl.$^7$ .............................................. C23C 14/34
(52) U.S. Cl. .......................... 204/192.17; 204/192.12; 204/192.3; 204/192.22; 204/298.06; 204/298.18; 204/298.21; 204/298.26; 204/298.12; 204/292.13
(58) Field of Search ................... 204/298.06, 298.09, 204/298.12, 298.15, 298.16, 298.18, 298.21, 298.26, 298.07, 192.12, 192.25, 192.3, 192.17, 192.22, 298.13

(56) References Cited

U.S. PATENT DOCUMENTS

| | | | | |
|---|---|---|---|---|
| 4,999,096 A | * | 3/1991 | Nihei et al. | 204/298.06 |
| 5,178,739 A | * | 1/1993 | Barnes et al. | 204/198.12 |
| 5,280,154 A | | 1/1994 | Cuomo et al. | 204/298.31 |
| 5,409,587 A | | 4/1995 | Sandhu et al. | 204/192.12 |
| 5,431,799 A | * | 7/1995 | Mosely et al. | 204/298.06 |

FOREIGN PATENT DOCUMENTS

| | | | | |
|---|---|---|---|---|
| JP | 61-190070 | * | 8/1986 | 204/298.06 |
| JP | 64-55379 | * | 3/1989 | 204/298.06 |

OTHER PUBLICATIONS

Joshi et al., "Collimated Sputtering of TiN/Ti Liners Into Sub–Half Micron High Aspect Ratio Contacts/Liners," Proc VMIC Conference, Jun. 9–10, 1992, pp. 253–259.
S. M. Rossnagel et al., "Metal ion deposition from ionized mangetron sputtering discharge," J. Vac. Sci, Technol. B 12(1), Jan./Feb. 1994, pp. 449–453.
J. Hopwood et al., "Mechanisms for highly ionized magnetron sputtering," J. Appl. Phys., vol. 78, No. 2, Jul. 15, 1995, pp. 758–765.

* cited by examiner

Primary Examiner—Rodney G. McDonald (57) ABSTRACT

The uniformity, density and directionality of an ionized metal plasma is significantly improved by positioning a cylindrical target between an RF coil and the chamber wall and wafers above and below the coil at opposite ends of the sputtering chamber. Ions generated by electron impact are attracted to the biased substrates, thereby providing essentially void free interconnections through insulating layers having through holes with very high aspect ratios.

29 Claims, 5 Drawing Sheets

REACTOR AND METHOD FOR IONIZED METAL DEPOSITION

TECHNICAL FIELD

The present invention relates to a reactor for ionized metal deposition and to a method for forming an interconnection structure by ionized metal deposition. The invention has particular application in submicron integrated circuit manufacturing involving interconnection structures comprising contacts/vias with high aspect ratios.

BACKGROUND ART

The escalating requirements for high density and performance associated with ultra large scale integration semiconductor wiring require responsive changes in interconnection technology, which is considered one of the most demanding aspects of ultra large scale integration technology. As the design rule for integrated circuits decreases below 0.25 μm, it becomes increasingly more challenging to voidlessly fill through holes for contacts and vias of interconnection patterns employing conventional technology, particularly through holes having aspect ratios greater than 3:1.

Conventional magnetron sputtering techniques involving either direct current or radio frequency sputtering suffer from recognized drawbacks, notably the difficulty of achieving conformal coverage deep within the high aspect ratio steps of contacts or vias on semiconductor devices. Atoms are directed toward the wafer surface at varying angles and, hence, only a relatively small portion of the sputtered atoms arrive at the wafer surface at an angle substantially perpendicular to the wafer surface. As a result of the varying angles at which atoms strike the wafer, it is difficult to achieve a conformal coating deep within contacts and vias, particularly since the amount of perpendicularly angled atoms is small with respect to the non-perpendicularly angled atoms. As a result of such poorly directionalized fluxes of predominantly neutral atoms, contacts and vias having high aspect ratios inevitably contain voids.

A prior attempt to overcome such a drawback comprises the use of a collimator. See, for example, Joshi et al., "Collimated Sputtering of TiN/Ti Liners Into Sub-Half Micron High Aspect Ratio Contacts/Lines," Proc. VMIC Conference, Jun. 9–10, 1992, pp. 253–259 and Sandhu et al., U.S. Pat. No. 5,409,587, wherein the use of a collimator is disclosed.

Figure 1:
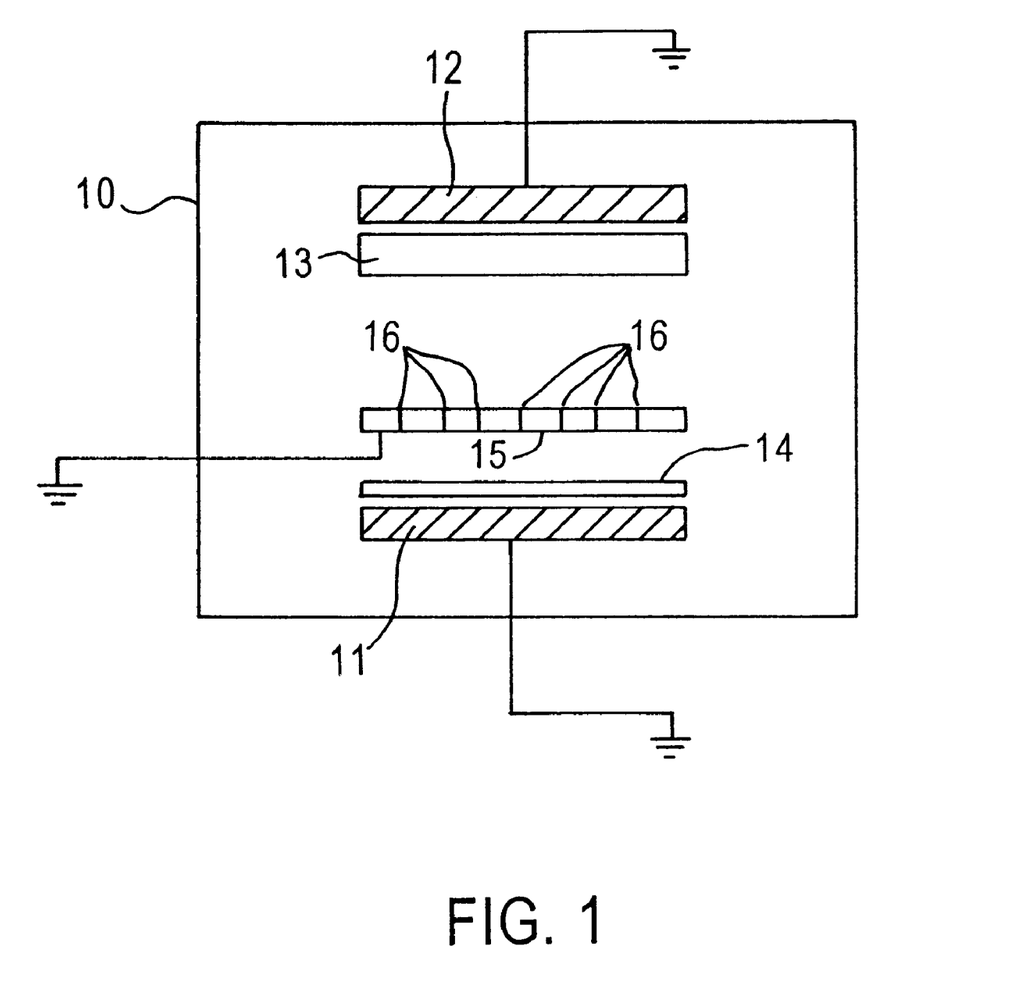
FIG. 1 schematically illustrates a conventional sputtering apparatus containing a collimator.

The use of a conventional collimator is illustrated in FIG. 1 which is similar to FIG. 4 of Sandhu et al., wherein sputtering chamber 10 comprises wafer support 11, target support 12, target 13 and wafer 14. Collimator 15 is positioned between target 13 and wafer 14 for filtering atoms sputtered from target 13 onto wafer 14. The dislodged target atoms pass through openings 16 in collimator 15 and onto wafer 14. Sputtering chambers containing collimators suffer from various disadvantages, including coating of the collimator and openings therein with dislodged target atoms.

A more recent approach in the evolution of high aspect ratio contact/via interconnection technology involves the ionization of sputtered metals by a high-density plasma. See S. M. Rossnagel et al., "Metal ion deposition from ionized mangetron sputtering discharge," J. Vac. Sci. Technol. B 12(1), January/February 1994, pp. 449–453 and J. Hopwood et al., "Mechanisms for highly ionized magnetron sputtering," J. Appl. Phys., Vol. 78, No. 2, Jul. 15, 1995, pp. 758–765. The ionization of sputtered metals is predicated upon conventional magnetron sputtering with the addition of a high density inductively coupled radio frequency (RF) plasma in the region between the sputtering cathode and wafer. The sputtered metal atoms are ionized and accelerated to the wafer by a low voltage bias such that metal ions arrive at a direction substantially perpendicular to the wafer surface. Ionization fractions have been achieved up to 85%. Thus, a high density plasma of highly ionized metal is produced and the directionality of the ionized plasma controlled by the application of a conventional RF or DC bias to the substrate.

There is, also, a recognized need to improve RF induced plasma processing by generating a greater percent of ionized sputtered material, i.e., density, increasing uniformity and improving directionality, particularly for fabricating interconnection patterns with contacts and vias having high aspect ratios. See Cuomo et al., U.S. Pat. No. 5,280,154, wherein this problem was addressed by providing a coil having a generally flattened surface defined by parallel conductors.

There exists a need for further advances in plasma processing to increase the uniformity, density and directionality of the generated plasma to enable voidlessly filling contacts/vias having a high aspect ratio.

DISCLOSURE OF THE INVENTION

An object of the present invention is a high density plasma sputtering apparatus capable of voidlessly filling through holes to form contacts and vias having high aspect ratios.

Another object of the present invention is a method of forming an interconnection pattern in a semiconductor device having contacts and vias with high aspect ratios.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a plasma sputtering apparatus comprising: a chamber having an upper end, a lower end, and a vertical side surface connecting the upper and lower ends; a first wafer support located at the lower end of the chamber; a second wafer support located at the upper end of the chamber; a coil of conductive material disposed between the first and second wafer supports; a target support positioned between the vertical side surface and the coil; means for applying radio frequency energy to the coil; and means for applying a radio frequency or direct current bias to each wafer support.

Another aspect of the present invention is a method of forming an interconnection in a semiconductor device, which method comprises: providing a sputtering chamber having an upper end, a lower end and a vertical side surface connecting the upper and lower ends, a first wafer support located at the lower end of the chamber, a second wafer support located a the upper end of the chamber, a coil of conductive material disposed between the first and second wafer supports, a target support positioned between the vertical side surface and the coil, means for applying a radio frequency energy to the coil and means for applying radio frequency or direct current bias to each wafer support; mounting a target to the target support; mounting a wafer to each wafer support; applying a bias to each wafer support; and generating a high density plasma of target material ions which are directed toward the wafers substantially perpendicular to the surface of the wafers.

Additional objects and advantages of the present invention will become readily apparent to those having ordinary skill in the art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 2:
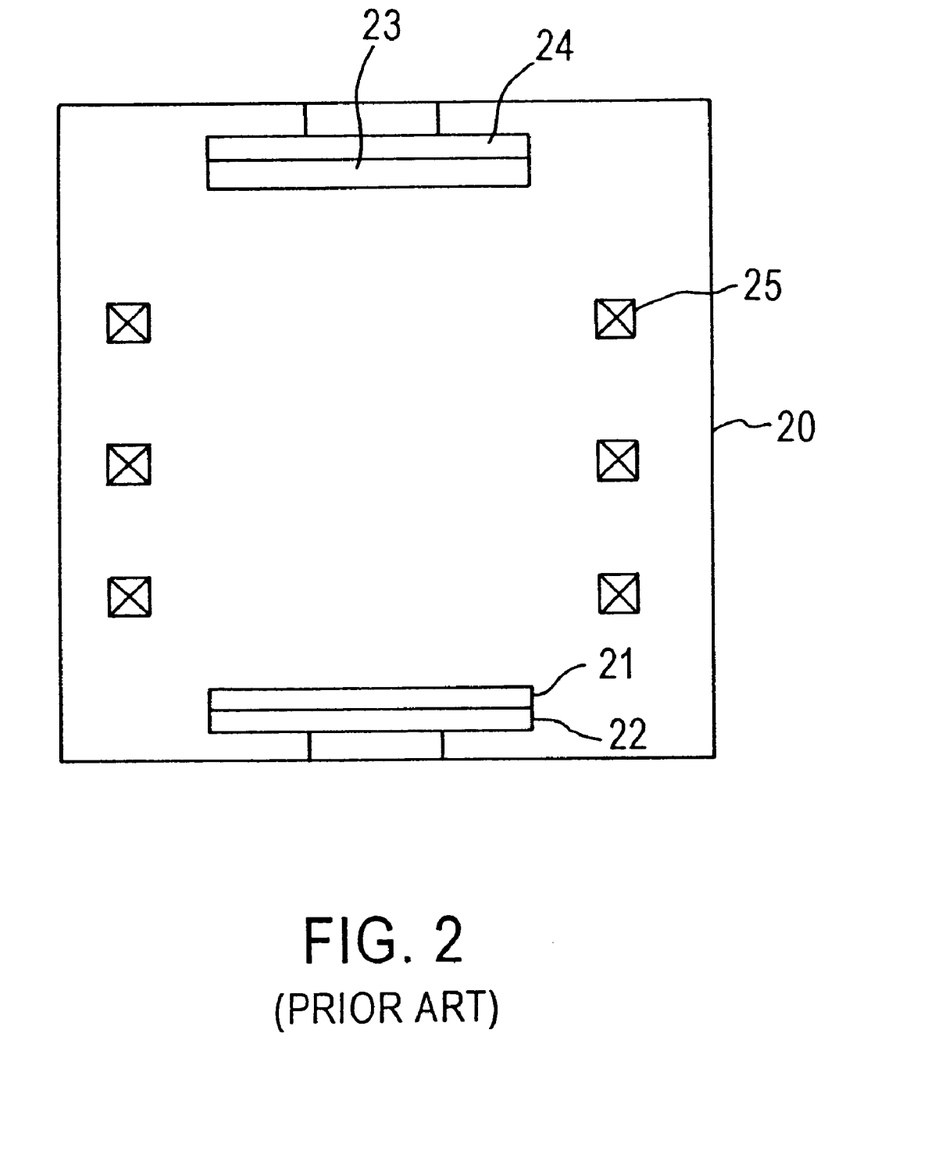
FIG. 2 schematically illustrates a conventional high-density RF induction plasma chamber.

The present invention comprises an apparatus and method for improving the uniformity, density and directionality of a high-density RF induction plasma in a sputtering system, thereby enabling voidless filling of contact holes to form contacts and vias having high aspect ratios, i.e., in excess of 3.1, such as in excess of 4.1 and even in excess of 5.1. A conventional RF induction plasma processing chamber 20 is shown in FIG. 2 and comprises wafer 21 mounted on biased wafer support 22, target 23 mounted on target support 24, and one or more RF coils 25. Atoms sputtered from target 23 are ionized in an electron source region generated by the RF coil or coils resulting in the generation of a plasma. The conventional RF induction plasma system depicted in FIG. 2 basically results in a plasma which does not adequately fill high aspect ratio contacts and vias in a voidless manner.

Figure 3:
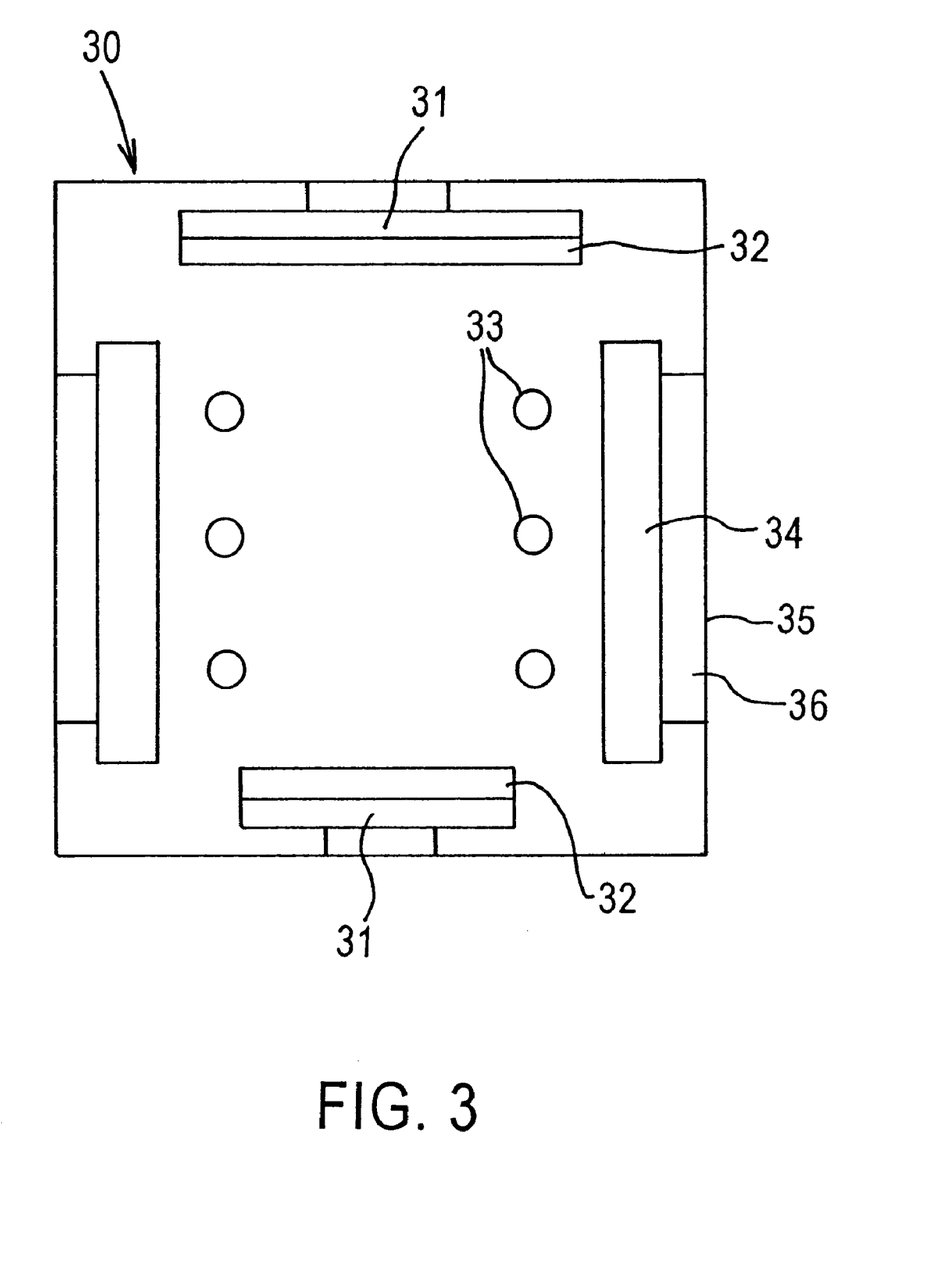
FIG. 3 schematically illustrates a high-density RF induction plasma sputtering chamber in accordance with the present invention.

In accordance with the present invention, the uniformity, density and directionality of the RF generated plasma is improved by the strategic positioning of the target material between the vertical side surface of a sputtering chamber and the RF coil(s), and by positioning wafer supports at the upper and lower ends of the chamber. An embodiment of the present invention is schematically illustrated in FIG. 3, wherein high density plasma sputtering chamber 30 comprises wafer supports 31 mounted at upper and lower ends of chamber 30, and wafers 32 mounted thereto. In addition, the RF high density plasma sputtering apparatus of the present invention comprises one or more RF coils 33 positioned intermediate upper and lower wafer supports 31. In accordance with the present invention, unlike conventional RF plasma sputtering systems, target 34 is positioned intermediate the RF coil (s) and vertical side surface 35 of chamber 30 and mounted to vertical side surface 35 by target support 36.

Figure 4:
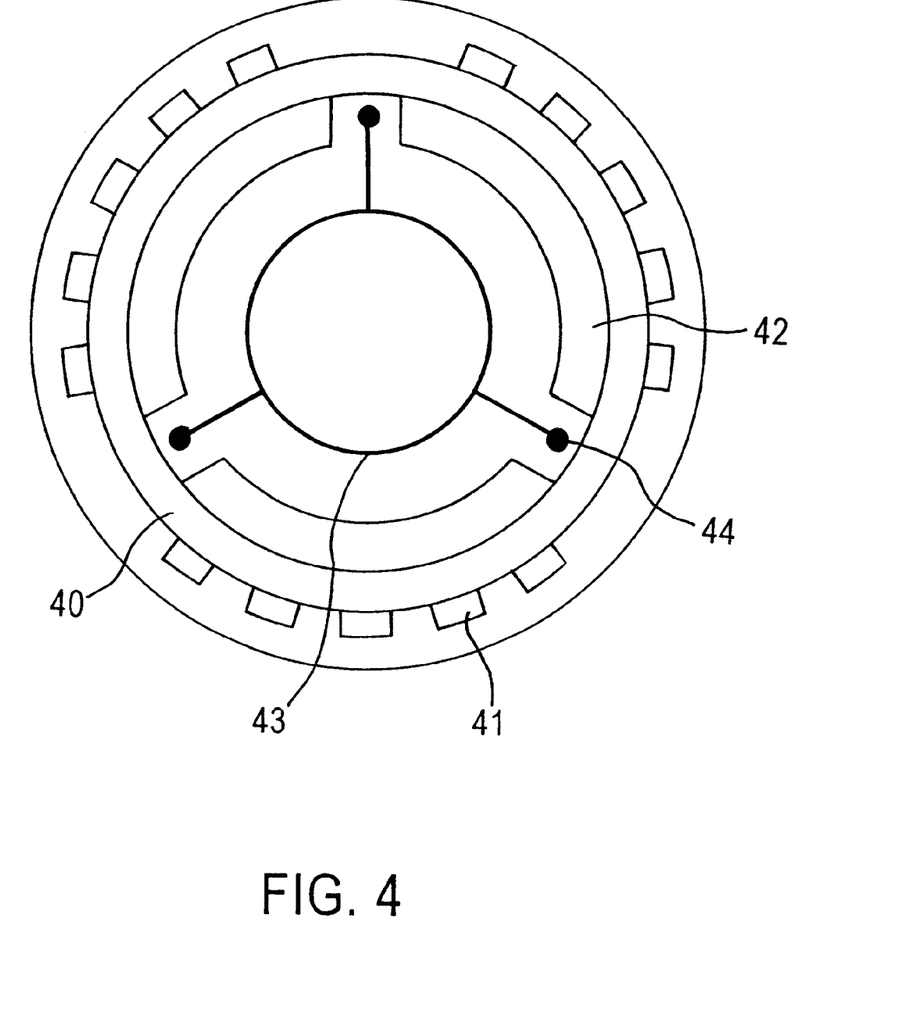
FIG. 4 schematically illustrates a top view showing segmented targets in accordance with an embodiment of the present invention.
Figure 5:
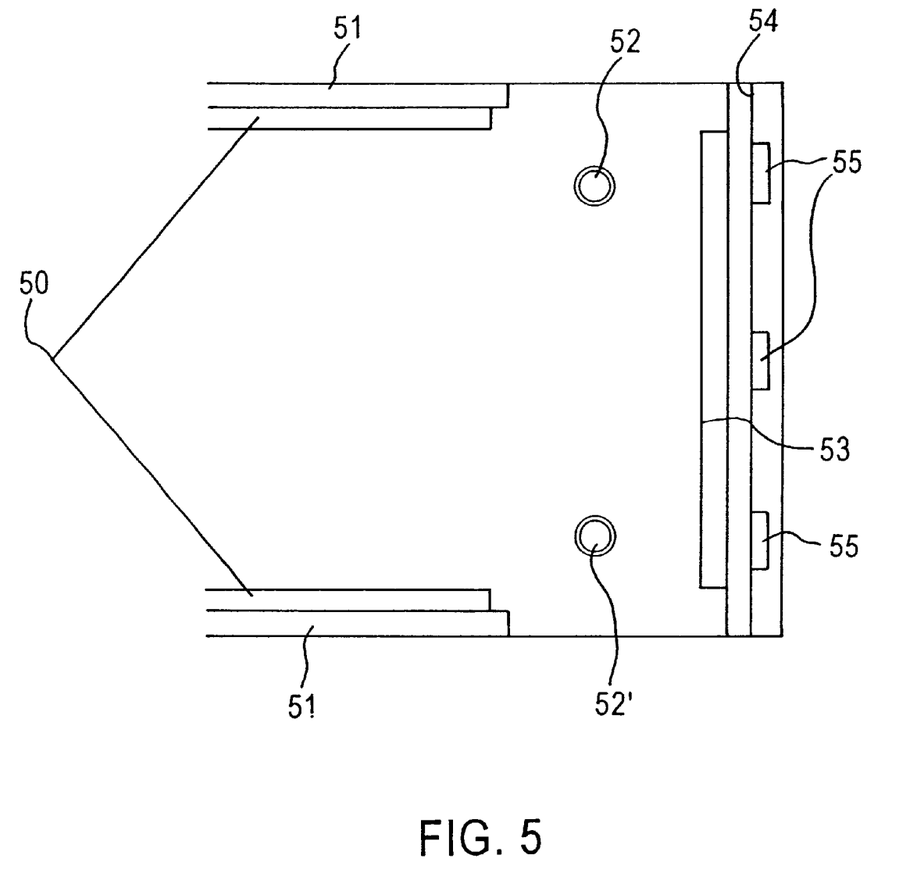
FIG. 5 schematically illustrates a vertical view of an embodiment of the present invention.

In one aspect of this embodiment, target 34 is cylindrical in shape, and the target support 36 is provided in any suitable shape, preferably cylindrical. In another aspect, target 34 comprises a plurality of segments mounted to target support 36 extending up to about 360° around the coil(s). Segmented targets 42 are illustrated in FIG. 4, along with coil 43, coil holder 44, permanent magnets 41 and cooling channel 40. Adverting to FIG. 5, there is shown wafer 50 supported by biased wafer holder 51, coil 52, D.C. magnetron target 53, cooling channel 54 and permanent magnets 55. In another embodiment, the vertical side surface 35 of the high density plasma sputtering chamber 30 depicted in FIG. 3 is cylindrical in shape and a cylindrical target is mounted thereto by mounting means which can also be cylindrical in shape.

The number of coils employed in a particular system can be easily optimized. As one having ordinary skill in the art is aware, increasing the number of coils enables increasing the power; however, a shadowing effect is caused by the presence of coils. Accordingly, in a particular situation, one having ordinary skill in the art can easily optimize the number of coils.

As in conventional sputtering systems, the chamber of the present invention also comprises a gas inlet and outlet (not shown) for injecting an inert gas, preferably argon or neon, into the chamber to achieve a desired pressure. In practicing the claimed invention, one having ordinary skill in the art can easily optimize the relevant process parameters to effect high density RF induction plasma sputtering. For example, it has been found that the application of about 1 to about 3 kv to each coil, an internal pressure of about 15 to about 25 mTorr, with a bias of about −100 to about −200 volts to the target support, suitably produce a substantially uniform, high density plasma of substantially 100% ionized atoms, with high directionality, thereby enabling voidless filling of contacts and vias having aspect ratios in excess of about 5:1.

The present invention can be advantageously employed to produce interconnection patterns in a semiconductor device comprising contacts and vias having high aspect ratios. The present invention, therefore, provides a method of forming an interconnection pattern in a semiconductor device by mounting a target, preferably a cylindrical target, to a target support in a high density RF induction plasma sputtering chamber, such as that depicted in FIG. 3, and mounting wafers to the upper and lower wafer supports. A bias is applied to each wafer support and an RF generated plasma is produced having high uniformity, density and directionality. In applying a bias voltage to the wafer support, it has been found advantageous to apply a bias to the wafer at the upper end of the chamber of about 5 to about 10 volts lower than the bias applied to the wafer support positioned at the lower end of the chamber to overcome gravitational effects.

The present invention is applicable to the formation of any type of interconnection structure, including those comprising barrier layers and anti-reflection coatings. The present invention can be used to deposit any type of material conventionally employed in the formation of interconnections, such as aluminum, titanium, tungsten, copper alloys thereof or titanium nitride.

The reason why the configuration of the high density RF induction plasma sputtering chamber in accordance with the present invention provides a plasma having greater uniformity, density and directionality is not known. It is, however, believed that the geometric configuration of the present invention produces a plasma having a greater uniformity and higher density by maximizing electron-impact ionization vis-à-vis penning ionization which is generated by impact with an inert gas in the excited state. Neutral atoms sputtered from the target in the present invention have overcosine distribution, and wafers are perpendicular to the peak emission flux. Therefore, very little, if any, of the neutral atoms impinge on the wafer. The omittance of such neutral atoms improves directionality of the RF induction plasma. It is also believed that the increase in density in accordance with the present invention is due, at least in part, to the increased size of the target. Thus, the plasma of ionized sputtered material generated in accordance with the present invention exhibits greater uniformity and density as well as improved directionality, thereby enabling voidless filling of through holes for contacts and vias of interconnection patterns having aspect ratios in excess of 5:1. The present invention is applicable to any phase of semiconductor processing wherein interconnection patterns are formed, particularly integrated circuits having a design rule of less than 0.25 μm.

Only the preferred embodiment of the invention and but a few examples of its versatility are shown and described in the present invention. It is to be understood that the invention is capable of use in various other combinations and environments and is capable of changes or modifications within the scope of the inventive concept as expressed herein.

What is claimed is:

1. A plasma sputtering apparatus comprising:
   a chamber having an upper end, a lower end, and a vertical side surface connecting the upper and lower ends;
   a first wafer support located at the lower end of the chamber;
   a second wafer support located at the upper end of the chamber;
   a coil of conductive material disposed between the first and second wafer supports;
   a target support positioned between the vertical side surface and the coil;
   means for applying radio frequency energy to the coil; and
   means for applying a radio frequency or direct current bias to each wafer support.

2. The plasma sputtering apparatus according to claim 1, wherein the target support is cylindrical in shape.

3. The plasma sputtering apparatus according to claim 2, wherein the target comprises a plurality of individual segments extending around the coil.

4. The plasma sputtering apparatus according to claim 3, wherein the segments extend about 360° around the coil.

5. The plasma sputtering apparatus according to claim 1, further comprising:
   a first wafer mounted to the first wafer support;
   a second wafer mounted to the second wafer support; and
   a target mounted to the target support.

6. The plasma sputtering apparatus according to claim 5, wherein the target is cylindrical in shape.

7. The plasma sputtering apparatus according to claim 6, wherein each wafer comprises a semiconductor substrate.

8. The plasma sputtering apparatus according to claim 7, wherein the target comprises aluminum, titanium, tungsten, copper or an alloy thereof, or titanium nitride.

9. The plasma sputtering apparatus according to claim 1, further comprising a gas inlet and a gas outlet.

10. The plasma sputtering apparatus according to claim 1, wherein the vertical side surface is cylindrical in shape.

11. The plasma sputtering apparatus according to claim 10, wherein the target is cylindrical in shape and mounted to the vertical side surface by the target support.

12. The plasma sputtering apparatus according to claim 1, comprising a plurality of coils of conductive material between the first and second wafer supports.

13. A method of forming an interconnection in a semiconductor device, which method comprises:
   providing a sputtering chamber having an upper end, a lower end and a vertical side surface connecting the upper and lower ends, a first wafer support located at the lower end of the chamber, a second wafer support located at the upper end of the chamber, a coil of conductive material disposed between the first and second wafer supports, a target support positioned between the vertical side surface and the coil, means for applying radio frequency energy to the coil and means for applying a radio frequency or direct current bias to each wafer support;
   mounting a target to the target support;
   mounting a wafer to each wafer support;
   applying a bias to each wafer support; and
   generating a high density plasma of target material ions which are directed toward the wafers substantially perpendicular to the surface of the wafers.

14. The method of forming an interconnection in a semiconductor device according to claim 13, wherein the high density plasma is generated by inducing an inert gas flow which impacts the target.

15. The method of forming an interconnection in a semiconductor device according to claim 13, wherein the wafers comprise an insulating layer having a through hole with an aspect ratio of at least 3:1.

16. The method of forming an interconnection in a semiconductor device according to claim 15, wherein the aspect ratio is at least 4:1.

17. The method of forming an interconnection in a semiconductor device according to claim 16, wherein the aspect ratio is at least 5:1.

18. The method of forming an interconnection in a semiconductor device according to claim 13, wherein the target support is cylindrical in shape.

19. The method of forming an interconnection in a semiconductor device according to claim 18, wherein the target comprises a plurality of individual segments extending around the coil.

20. The method of forming an interconnection in a semiconductor device according to claim 19, wherein the segments extend about 360° around the coil.

21. The method of forming an interconnection in a semiconductor device according to claim 18, wherein the target comprises aluminum, titanium, tungsten, copper, an alloy thereof, or titanium nitride.

22. The method of forming an interconnection in a semiconductor device according to claim 13, wherein the target is cylindrical in shape.

23. The method of forming an interconnection in a semiconductor device according to claim 13, further comprising introducing an inert gas into the chamber.

24. The method of forming an interconnection in a semiconductor device according to claim 23, wherein inert gas is argon or neon.

25. The method of forming an interconnection in a semiconductor device according to claim 13, further comprising:
   applying about 1 to about 3 kv to the coil;
   maintaining a gas pressure of about 15 to about 25 mTorr; and
   applying a bias to each wafer support of about −100 to about −200 volts.

26. The method of forming an interconnection in a semiconductor device according to claim 25, comprising applying a bias to the second wafer support of about 5 to about 10 volts lower than the bias applied to the first wafer support.

27. The method of forming an interconnection in a semiconductor device according to claim 13, wherein the vertical side surface is cylindrical in shape.

28. The method of forming an interconnection in a semiconductor device according to claim 27, wherein the target is cylindrical in shape and mounted to the vertical side surface by the target support.

29. The method of forming an interconnection in a semiconductor device according to claim 13, wherein the chamber comprises a plurality of coils of conductive material between the first and second wafer supports.

* * * * *

UNITED STATES PATENT AND TRADEMARK OFFICE
CERTIFICATE OF CORRECTION

PATENT NO.    : 6,340,417 B1
DATED         : January 22, 2002
INVENTOR(S)   : Krivokapic It is certified that error appears in the above-identified patent and that said Letters Patent is hereby corrected as shown below:

<u>Title page,</u>
Item [*] Notice, delete "0" and insert -- 858 --.

Signed and Sealed this

Eighth Day of July, 2003

JAMES E. ROGAN
*Director of the United States Patent and Trademark Office*